United States Patent [19]

Kawakami

[11] Patent Number: 4,596,959
[45] Date of Patent: Jun. 24, 1986

[54] SERIES BIASING SCHEME FOR FIELD EFFECT TRANSISTORS

[75] Inventor: Kenneth Kawakami, Sunnyvale, Calif.

[73] Assignee: Microwave Technology, Inc., Fremont, Calif.

[21] Appl. No.: 674,200

[22] Filed: Nov. 23, 1984

[51] Int. Cl.$^4$ ............................ H03F 3/26; H03F 3/16
[52] U.S. Cl. .................................... 330/269; 330/277; 330/296
[58] Field of Search ................ 330/269, 273, 277, 296

[56] References Cited

U.S. PATENT DOCUMENTS 4,241,316 12/1980 Knapp ................................ 330/277

Primary Examiner—James B. Mullins
Assistant Examiner—G. Wan
Attorney, Agent, or Firm—Alan H. MacPherson; Steven F. Caserza; Richard Franklin

[57] ABSTRACT

A series biasing arrangement for a pair of junction field effect transistors (JFETs), which may be used in RF amplifiers, mixers or oscillators, comprises connecting the JFETs together in series, with the gates of the two JFETs selectively connected to different reference potentials. The first FET is also connected to the DC voltage source. In one embodiment of the invention, two operational amplifiers, whose output leads are connected to the gates of corresponding JFETs have their noninverting input leads connected to selected points on a voltage divider made up of three resistors and their inverting input leads each connected to the source of a corresponding JFET. The drain to source voltage drops across the JFETs are controlled solely by the values of two of the resistors in the three resistor voltage divider. The bias current through the series-connected JFETs can be controlled independently of the drain to source voltage drops across each of the JFETs. The two FETs need not be closely matched.

19 Claims, 7 Drawing Figures

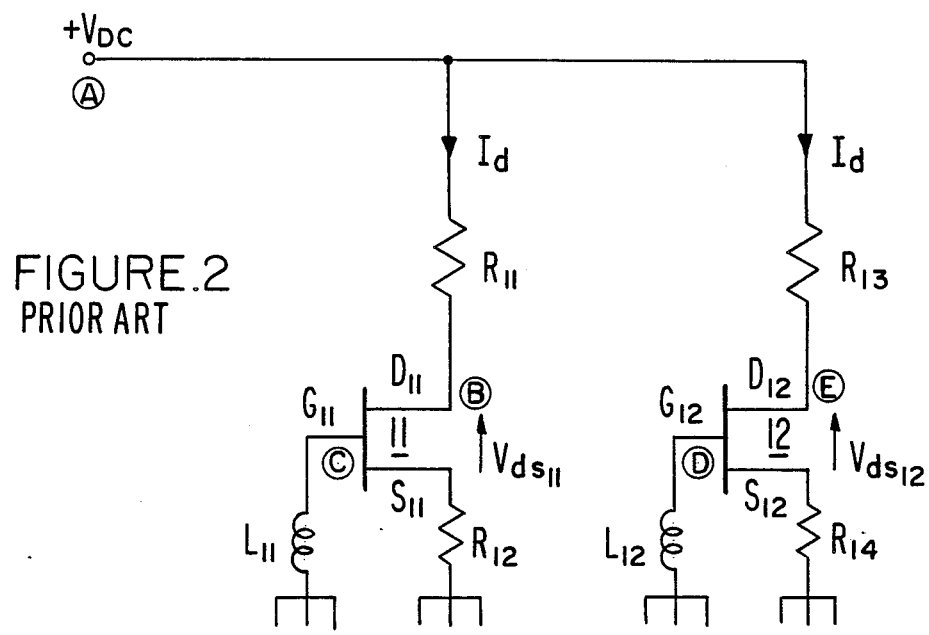
FIGURE.2
PRIOR ART
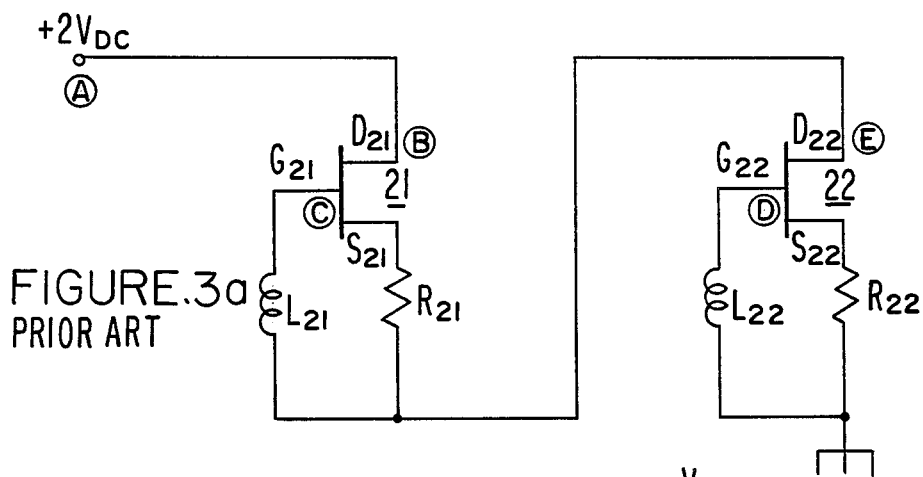
FIGURE.3a
PRIOR ART
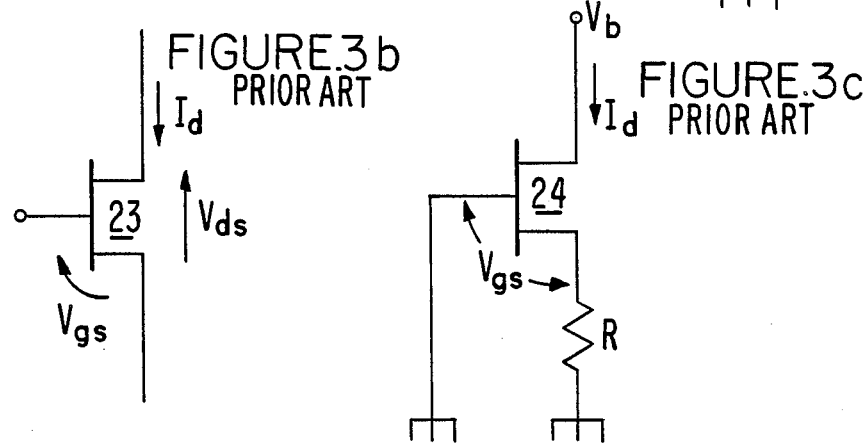
FIGURE.3b
PRIOR ART
FIGURE.3c
PRIOR ART

SERIES BIASING SCHEM[
TRANSIS[

BACKGR[

1. Field of the Invention

This invention relates to a
effect transistors, hereinafter [
more particularly to a series bi[
FETs, particularly useful in
quency (RF) amplifiers, mixer
current applications.

2. Description of the Prior [

FETs are frequently employ
in RF amplifiers. Mixers or
FETs as active devices as w[
generally do not operate at [
quired, most microwave devic[
transistors made of gallium ar[
cally possible to manufacture
sistors of gallium arsenide. Ho[
of holes, which serve as the ma
nel devices, is much less than [
which serve as the majority c
vices, P channel devices are r[

The FET devices must be t[
DC voltages so that they can
input signal. Certain amplifier
anced amplifier and the push-p[
are two identical branches co[
with specific phase relationshi[
be in pairs. The balanced ampl
to a specific amplifier topolog[
active elements, that exhibits
return loss characteristics. The
is similar to the balanced ampl[
180° rather than 90° couplers. [
scheme is to bias these pairs i[
twice the DC current of any s A close matching of the FE[
to provide the proper biasing
series. Series biasing guarantee
each of the FETs is equal bec[
current. The drain to source
equal. However, in general,
build a large number of JFETs
istics. The values of the pinch [
saturated current ($I_{dss}$) associat
single wafer in which a plurali
can typically vary by a factor o
the wafer. Therefore, in a pa
factory adjusted resistor is nee[
to a given bias point. This adju[
money.

Roveti, in U.S. Pat. No. 3,65[
limiter comprised of a pair o[
connected in series with a bia[
transistors has a lower cut-off [
and the one with the higher c
substantially higher resistance [
higher voltages. Roveti's devi[
problem of unequal voltage dr[
Rather, the operation of his de
voltage drops across the tw[
effect transistors.

A biasing arrangement, des[
U.S. Pat. No. 4,037,166, inclu[
field effect transistors (FETs), [

An active bias implementation of the invention comprises two N-channel JFETs biased in series. Three resistors are connected in series between a voltage source and ground. The drain of the first JFET is also connected to the voltage source. The source of the first JFET is connected directly to the drain of the second JFET while the source of the second JFET is connected through a fourth resistor to ground. The noninverting input leads of two operational amplifiers are connected between the first and second, and between the second and third resistors, respectively, of the three series connected resistors. The inverting input leads of the first and second operational amplifiers are connected directly to the sources of the first and second JFETs, respectively; the output leads of the first and second operational amplifiers are connected to the first and second JFET gates, respectively. The source of the second JFET and the second inverting input lead are connected together and through the fourth resistor to ground.

One of the objects of this invention is to provide a means to series bias the JFET pairs. A related object is to provide a JFET structure which requires one-half the current of the prior art parallel biasing arrangements. A lower biasing current makes possible RF amplifiers for applications in which the available DC bias current is limited, thus allowing JFET amplifiers to be used in low current applications. A third object is to provide a means to independently control the gate potential of one or more JFETs so as to make possible the series biasing of JFETs of unequal characteristics. This eliminates factory adjustment of the circuit employing the JFETs and thus saves time and money. These and other goals and features of this invention will become apparent from a reading of the detailed description of the invention taken in connection with the following drawings.

BRIEF DESCRIPTION OF THE DRAWINGS

FIG. 2 shows a prior art arrangement for DC biasing two JFETs in parallel;

FIG. 3(a) shows one method of series biasing a pair of JFETs, but which fails to solve the problem of having to closely match the JFETs;

FIG. 3(b) shows the schematic representation of a single JFET of the type used in this invention;

FIG. 3(c) shows the schematic representation of a single JFET of the type used in the parallel and series biasing schemes, which is further connected to ground;

DETAILED DESCRIPTION

The JFET series biasing arrangement of this invention, while disclosed in combination with an RF amplifier, may be used whenever biasing of JFETs is desired in low current applications, such as in mixers or oscillators that employ JFETs as active devices. While the embodiments of the invention described use N-channel JFETs, the invention may be used to bias P-channel JFETs, as well.

Figure 1:
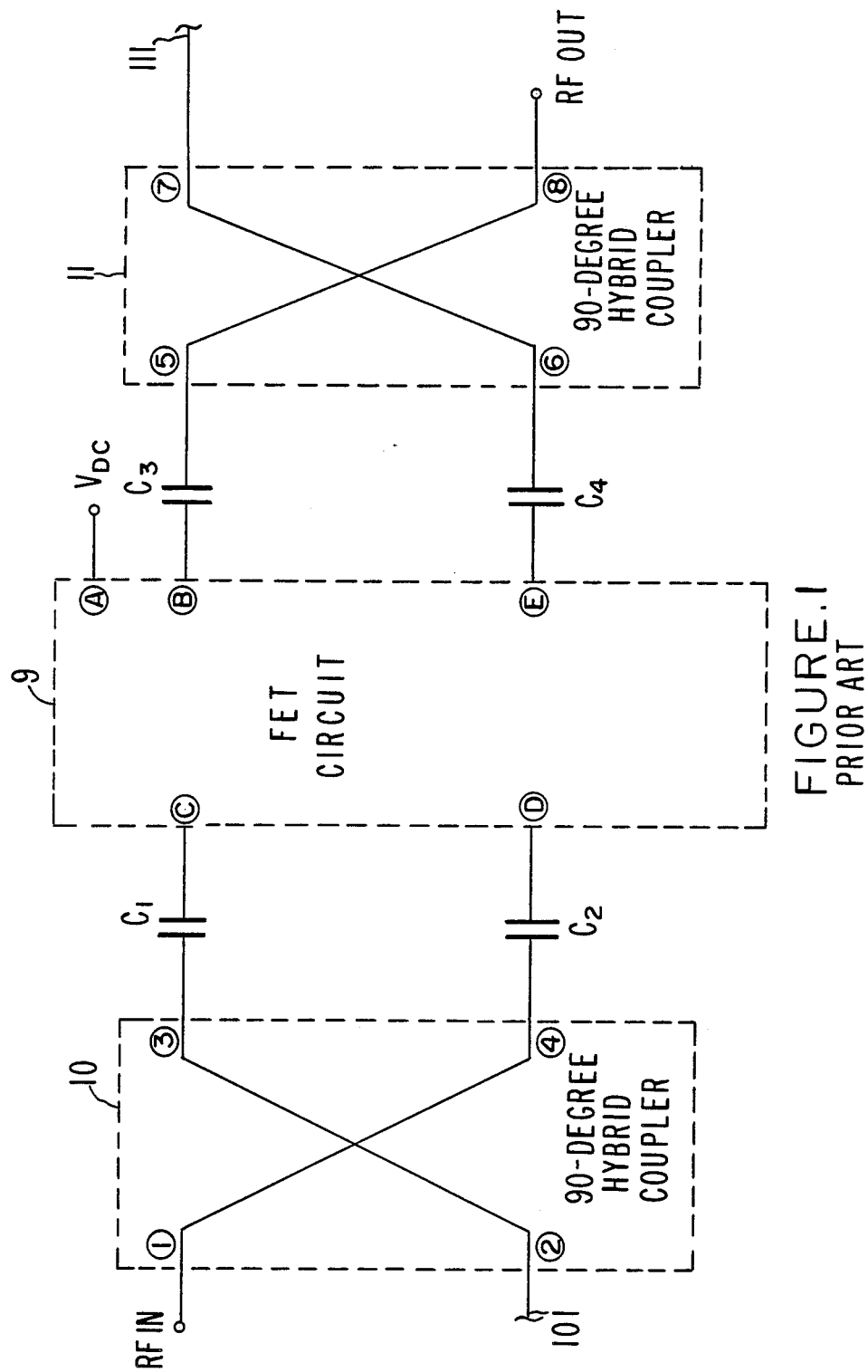
FIG. 1 shows a balanced configuration RF amplifier in which a FET biasing circuit is utilized.

FIG. 1 shows a balanced configuration RF amplifier in which an FET biasing scheme is utilized. The RF amplifier receives an RF input signal on input lead 1 which is then fed to 90° hybrid coupler 10. Input lead 2 is connected to an RF load 101. 90° hybrid couplers 10 and 11 serve to improve the return loss of the input and output leads 1 and 8 respectively. To reduce the return loss associated with a signal applied to inputs C or D of FET circuit 9, 90° hybrid coupler 10 acts so as to direct the return signal to RF load 101 attached to lead 2 rather than to input lead 1. 90° hybrid coupler 10 provides RF signals on leads 3 and 4 which are capacitively coupled through capacitors C1 and C2, respectively, to input leads C and D of FET circuit 9. FET circuit 9 provides amplified RF signals on its output leads B and E which are capacitively coupled via capacitors C3 and C4 to input leads 5 and 6 of 90° hybrid coupler 11. Coupler 11 recombines the 90°-out-of-phase signals coming from leads B and E to place them in phase at output lead 8. When B and E have identical impedances, coupler 11 also directs the return signal from output lead 8 to RF load 111 connected to lead 7 of coupler 11. The 90° hybrid coupler 11 provides on its output lead 8 an RF output signal which is an amplified version of the RF input signal applied to input lead 1. A ground potential is applied to a ground plane not shown in FIG. 1 but well known to those skilled in the art. FET circuit 9 includes input lead A for receiving DC bias voltage which serves to establish the bias point of the field effect transistors contained within FET circuit 9, as will be more fully described later. The design theory of balanced transistor amplifiers is described in a paper by K. Kurokawa entitled "Design Theory of Balanced Transistor Amplifiers" published in Bell System Technical Journal, Vol. 44, No. 8, pgs. 1675 to 1698, in October, 1965.

The push-pull amplifier configuration is similar to FIG. 1 except that the hybrids 10 and 11 are 180° couplers rather than 90° couplers.

The use of letters A, B, C, D and E in FIGS. 2 through 5 refer to the points of the FET circuits shown in these Figures which correspond to the identically lettered connections to the RF amplifier configuration shown in FIG. 1.

FIG. 2 shows the prior art DC parallel biasing of a JFET pair. JFETs 11 and 12 are formed on a common or separate semiconductor substrate by known semiconductor integrated circuit techniques. JFETs 11 and 12 each have their gates $G_{11}$ and $G_{12}$ connected to ground through inductor $L_{11}$ and $L_{12}$, respectively. Drains $D_{11}$ and $D_{12}$ of JFETs 11 and 12 are connected to resistors $R_{11}$ and $R_{13}$, respectively, which are then connected to bias terminal A. Resistors $R_{12}$ and $R_{14}$ connect sources $S_{11}$ and $S_{12}$, respectively, to ground. In practice, inductors $L_{11}$ and $L_{12}$ are required between gate $G_{11}$ and ground, and gate $G_{12}$ and ground, respectively, to prevent short circuiting of the RF signal which is applied to these gates. This bias scheme requires adjustment of $R_{11}$ and $R_{12}$ for JFET 11, and $R_{13}$ and $R_{14}$ for JFET 12 so that the DC current $I_d$ and the drain to source voltages $V_{ds11}$ and $V_{ds12}$ will be equal across both JFET 11 and JFET 12.

FIG. 3(a) shows one method of series biasing JFETs 21 and 22. Drain $D_{21}$ of JFET 21 is connected to DC voltage source 2 $V_{DC}$. Source $S_{21}$ of JFET 21 is connected to resistor $R_{21}$, which is connected to inductor $L_{21}$ which in turn connects to gate $G_{21}$ of JFET 21. Resistor $R_{21}$ and inductor $L_{21}$ are connected to drain $D_{22}$ of JFET 22. Source $S_{22}$ of JFET 22 is connected to a second resistor $R_{22}$. Inductor $L_{22}$ is connected to gate G$_{22}$. Resistor R$_{22}$ and inducto
common to ground. The total
from the DC supply is one-half t
for the parallel JFETs of FIG
voltage required is twice as high
work, the arrangement of FIG.
ceptably close matching of the J
present state of the art of device
sonable to expect two JFETs tc
identical characteristics require
rangement.

The required matching of the
series may be shown analytically
A first order, linear approximatic
the linear region is given by $$I_d = I_{dss} + G_m V_{gs}$$

where I$_d$ is the current suppli
source; V$_{gs}$ is the value of the
and I$_{dss}$ and G$_m$ are values w
JFET, G$_m$ being the transcond
and I$_{dss}$ the drain to source satu
normal bias conditions, V$_{gs}$ is a n
the approximation of Equation
independent of the value of V$_c$
voltage, because all three term
G$_m$ and V$_{gs}$ are independent of Now consider the arrangeme
relevant equation is $$V_{gs} = -I_d R$$

Substituting this value of V$_{gs}$ int $$I_d = I_{dss}/(1 + G_m R)$$

Thus, the current I$_d$ supplied 1
ply is independent of the value
With respect to the DC power
FIG. 3(c) maintains a constant cu
be determined from Equation (3

FIG. 3(a) shows two such cons
devices, 21 and 22, in series. I
current law, which teaches that t
currents toward any point in a n
condition is impossible unless 1
loads maintain exactly the same
two FETs are even slightly mism
the FETs 21 and 22 become bi
region and Equation (1) is no 1
voltage across each of FETs 21
cantly different.

Figure 4:
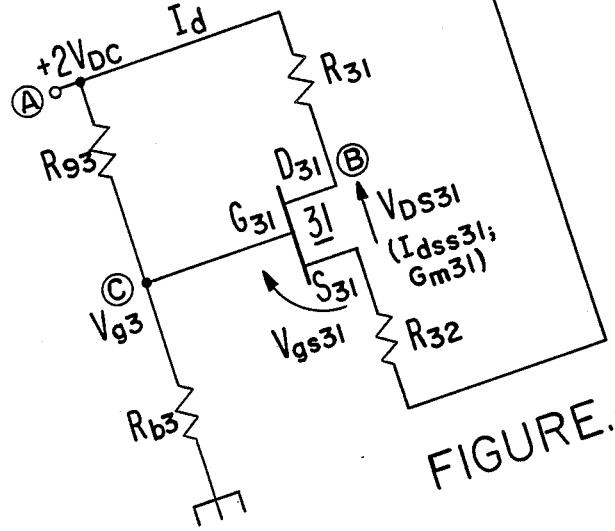
FIG. 4 shows one embodiment of the DC bias circuitry of the present invention, utilizing passive bias implementation.

FIG. 4 shows a passive bias i
present invention using a series bi
of JFETs. Resistor R$_{a3}$ and R$_{b3}$ a
to form a voltage divider betwee
2 V$_{DC}$ and ground. The node (c)
and R$_{b3}$ is connected to gate G$_{31}$
R$_{31}$ is connected between volta
drain D$_{31}$ to locally adjust the dra
JFET 31. If desired, R$_{31}$ may be
JFET 31 is connected to one lea
other lead of resistor R$_{32}$ is con
Resistor R$_{33}$ is further connecte
D$_{32}$ of JFET 32. Two resistive e
are used in this embodiment for p
and comparison. In the embodi
shown in FIG. 4, a single resis source $V_{DS}$ and ground with resistor $R_{43}$ being connected to ground. Resistor $R_{41}$, and drain $D_{41}$ of JFET 41, are both connected to voltage source $V_{DC}$.

The output voltage of operational amplifier $A_{41}$ is applied to gate $G_{41}$ of JFET 41 through resistor $R_{a4}$. The noninverting input lead of operational amplfier $A_{41}$ is connected to the node (c) between resistors $R_{41}$ and $R_{42}$. The inverting input lead of amplifier $A_{41}$ is connected through resistor $R_{b4}$ to the source $S_{41}$ of JFET 41 and to the drain $D_{42}$ of JFET 42. The output lead of operational amplifier $A_{42}$ is connected to resistor $R_{c4}$, which is connected to gate $G_{42}$ of JFET 42. The noninverting input lead of operational amplifier $A_{42}$ is connected to node (d) between resistors $R_{42}$ and $R_{43}$; the inverting input lead of operational amplifier $A_{42}$ is connected to resistor $R_{d4}$ which in turn is connected to source $S_{42}$ of JFET 42. Source $S_{42}$ is connected through resistor $R_{44}$ to ground. $V_{DS42}$ is the voltage from drain $D_{42}$ to source $S_{42}$ across JFET 42; $V_{DS41}$ is the voltage from drain $D_{41}$ to source $S_{41}$ across JFET 41.

Resistor $R_{43}$ controls the current through JFETS 41 and 42. The values of resistors $R_{41}$, $R_{42}$, and $R_{43}$ are held high so that these three resistors in series draw only a small current. Operational amplifiers $A_{41}$ and $A_{42}$ have high input impedances, and the voltages on their inverting input leads can be considered equal to the voltages on their noninverting input leads. No steady state current flows through resistors $R_{a4}$ through $R_{d4}$. Therefore, the voltage drop across $R_{41}$ equals drain to source voltage $V_{DS41}$ across JFET 41, and the voltage drop across $R_{42}$ equals the drain to source voltage $V_{DS42}$ across JFET 42. Resistors $R_{41}$ and $R_{42}$ are always chosen to be equal to each other so that the drain to source voltages across JFETs 41 and 42 will be equal. In one embodiment of FIG. 5, the values of $R_{41}$ and $R_{42}$ each are approximately 3K ohms.

Resistors $R_{a4}$, $R_{b4}$, $R_{c4}$ and $R_{d4}$ are decoupling resistors and not critical. Biasing current $I_{ds}$ flows from DC voltage source $V_{DC}$ through series-connected JFETs 41 and 42 to ground. Assuming an ideal operational amplifier (i.e., an amplifier with high input impedance and high gain), the voltage on the noninverting input lead of each of the operational amplifiers, $A_{41}$ and $A_{42}$, is equal to the voltage on its inverting input lead. In one embodiment, the voltage gain of each of operational amplifiers $A_{41}$ and $A_{42}$ is equal to 60 DB. The biasing arrangement of FIG. 5 requires no adjustment of any of the resistors $R_{41}$ through $R_{44}$ to obtain the desired bias voltage drops $V_{DS41}$ and $V_{DS42}$ across JFETs 41 and 42 and to obtain the desired biasing current $I_{ds}$, provided, of course, that resistors $R_{41}$ and $R_{42}$ are equal to each other.

Figure 5:
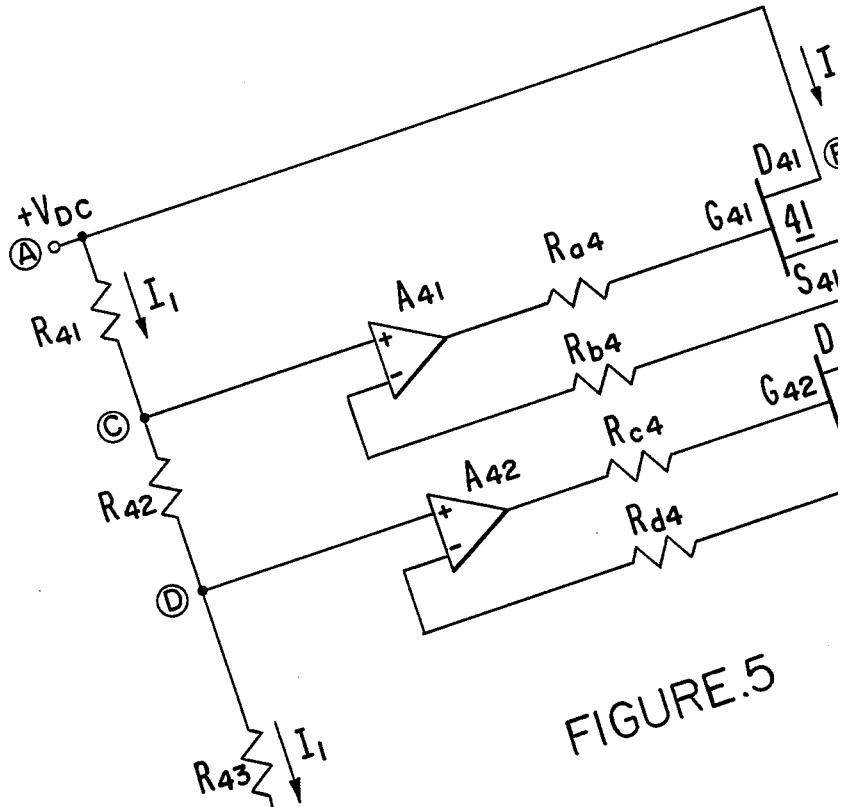
FIG. 5 shows an alternative embodiment of the present invention utilizing active bias implementation.

In the embodiment of FIG. 5, assuming $A_{41}$ and $A_{42}$ are ideal operational amplifiers, the current $I_1$ passes through resistors $R_{41}$, $R_{42}$ and $R_{43}$. Because the voltage on the inverting input lead of each operational amplifier $A_{41}$ and $A_{42}$ is substantially equal to the voltage on the noninverting input lead and substantially no current flows through resistors $R_{a4}$ to $R_{d4}$, the voltages $V_{DS41}$, $V_{DS42}$ and $V_{DC}$ are given by the following equations:

$$V_{DS41} = I_1 R_{41} \tag{9}$$

$$V_{DS42} = I_1 R_{42} \tag{10}$$

$$V_{DC} = I_1 R_{41} + I_1 R_{42} + I_1 R_{43} \tag{11}$$

$$V_{DC} = V_{DS41} + V_{DS42} + I_{ds} R_{44} \tag{12}$$

But it is also clear from equations (9), (10), (11) and (12) that $$V_{DC} = I_1(R_{41} + R_{42} + R_{43})$$

Substituting equations (9) and (10) into equation (12) and then solving for $I_1$ from equation (11) and substituting the result in equation (12) gives $V_{DC}$ in terms of $I_{ds}$ and resistors $R_{41}$, $R_{42}$, and $R_{43}$ and $R_{44}$.

$$V_{DC} = I_{ds} R_{44}(R_{41} + R_{42} + R_{43})/R_{43}$$

Alternatively, the same result is obtained from equations (9) and (10) an analysis of FIG. 5. Thus $$I_1 R_{43} = I_{ds} R_{44} \tag{13}$$

Accordingly, $$I_1 = I_{ds} \frac{R_{44}}{R_{43}} \tag{14}$$

Combining equations (11) and (14) gives $$V_{DC} = I_{ds} R_{44}(R_{41} + R_{42} + R_{43})/R_{43} \tag{15}$$

Therefore, the biasing current $I_{ds}$ and the voltages $V_{DS41}$ and $V_{DS42}$ are given by the following equations respectively:

$$I_{ds} = V_{DC} R_{43}/[R_{44}(R_{41} + R_{42} + R_{43})] \tag{16}$$

Combining equations (9) and (14) gives $$V_{DS41} = I_{ds} R_{44} R_{41}/R_{43} \tag{17}$$

Combining equatlons (10) and (14) gives $$V_{DS42} = I_{ds} R_{44} R_{42}/R_{43} \tag{18}$$

Since $I_{ds}$ in equations (17) and (18) is defined by equation (16) in terms of resistors $R_{41}$, $R_{42}$, $R_{43}$, $R_{44}$ and the supply voltage $V_{DC}$, equations (17) and (18) can be rewritten $$V_{DS41} = V_{DC} R_{41}/(R_{41} + R_{42} + R_{43}) \tag{19}$$

and $$V_{DS42} = V_{DC} R_{42}/(R_{41} + Rk_{42} + R_{43}) \tag{20}$$

Hence $I_{ds}$, $V_{DS41}$ and $V_{DS42}$ can be defined by properly choosin $R_{41}$, $R_{42}$, $R_{43}$ and $R_{44}$ and the voltages $V_{DS41}$ and $V_{DS42}$ across JFETs 41 and 42 are independent of $R_{44}$, $I_{ds}$ and the particular JFETs used. Nowhere do $I_{dss}$ and $G_m$ defined in conjunction with equation 1 above enter into the design equations (equations 16, 19 and 20) for this embodiment.

The above description will suggest to others skilled in the art additional ways in which the principles of this invention may be used without departing from its spirit. The above description is meant to be illustrative and not limiting.

What is claimed is:

1. A biasing arrangement for a pair of junction field effect transistors ("JFETs") comprising:
   an input terminal for connecting to a first reference potential;

a first and a second JFET, each
   drain, and a gate, said first an
   each being of a first conductiv
means for connecting the source
   said drain of said second JFE
means for connecting the source
   to a second reference potentia
means for connecting the gate of
   said second reference potentia
means for connecting the drain c
   said first reference potential;
voltage divider means connecte
   reference potential and said s
   tential; and
means for connecting the gate of
   selected point on said voltage 2. Structure as in claim 1 wherein
means comprises a first resistor an
and wherein the gate of said first JI
the node between said first resist
resistor.

3. Structure as in claim 2 wherein
means includes
   means for independently controll
   said first gate so as to closely
   source voltage of each of sa
   JFETs.

4. Structure as in claim 1 wherein
first JFET is connected to the d
JFET by a selected impedance.

5. Structure as in claim 4 wherein
dance comprises resistance means.

6. Structure as in claim 5 whe
means comprises two resistors in se

7. Structure as in claim 1 wherein
for connecting the source of said
second reference potential comprisi 8. An active biasing arrangement
connected in series comprising:
   an input terminal for receiving a fi
      tial;
   a first and a second JFET, each
      drain, and a gate, said first and s
      of a first conductivity type;
   means for connecting the source c
      the drain of said second JFET;
   first, second and third resistors c
      said first resistor also connected
      nal, and said third resistor be
      connected to a second referenc
   a first and a second operational am
      an inverting input lead, a noni
      and an output lead, the output l
      second operational amplifiers 1
      the gates of said first and secc
      tively, the inverting input lea
      second operatonal amplifiers 1
      the sources of said first and sec
      tively, and the noninverting inp
      and second operational amplifie
      respectively, between said first
      second and third resistors.

9. The biasing arrangement acc
further comprising means for indepe